(12) United States Patent
Dave et al.

(10) Patent No.: US 7,760,880 B2
(45) Date of Patent: Jul. 20, 2010

(54) DECODER ARCHITECTURE SYSTEM AND METHOD

(75) Inventors: Sameep Dave, Sagamore Hills, OH (US); Fan Mo, Sagamore Hills, OH (US)

(73) Assignee: ViaSat, Inc., Carlsbad, CA (US)

( * ) Notice: Subject to any disclaimer, the term of this patent is extended or adjusted under 35 U.S.C. 154(b) by 1049 days.

(21) Appl. No.: 11/249,197

(22) Filed: Oct. 13, 2005

(65) Prior Publication Data
US 2006/0107181 A1 May 18, 2006

Related U.S. Application Data

(60) Provisional application No. 60/618,309, filed on Oct. 13, 2004, provisional application No. 60/696,008, filed on Jul. 1, 2005.

(51) Int. Cl.
*H04N 7/167* (2006.01)
*H03M 13/00* (2006.01)

(52) U.S. Cl. .............. 380/240; 714/800; 714/801; 365/4; 365/185.09

(58) Field of Classification Search .......... 714/6, 714/100, 786, 699, 758, 800–801; 713/168, 713/174, 179; 380/225, 268, 273, 240; 365/4, 365/185.09
See application file for complete search history.

(56) References Cited

U.S. PATENT DOCUMENTS

| | | | |
|---|---|---|---|
| 7,162,684 B2* | 1/2007 | Hocevar | 714/800 |
| 7,184,486 B1* | 2/2007 | Wu et al. | 375/262 |
| 7,434,145 B2* | 10/2008 | Jin et al. | 714/780 |
| 2002/0184595 A1* | 12/2002 | Miyata et al. | 714/786 |
| 2003/0033575 A1* | 2/2003 | Richardson et al. | 714/799 |
| 2004/0047433 A1* | 3/2004 | Mogre et al. | 375/308 |
| 2005/0005231 A1 | 1/2005 | Sun et al. | |
| 2005/0204271 A1 | 9/2005 | Sharon et al. | |
| 2005/0204272 A1 | 9/2005 | Yamagishi | |
| 2005/0216821 A1 | 9/2005 | Harada | |
| 2005/0278604 A1* | 12/2005 | Yokokawa et al. | 714/758 |

FOREIGN PATENT DOCUMENTS

WO    WO 03021440 A1 * 3/2003

OTHER PUBLICATIONS

Engling Yeo, Payam Pakzad, Borivoje Nikolic, Venkat Anantharam; High Throughput Low-Density Parity-Check Decoder Architecture; 2001, IEEE.*

(Continued)

*Primary Examiner*—Taghi T Arani
*Assistant Examiner*—Mohammad L Rahman
(74) *Attorney, Agent, or Firm*—Townsend and Townsend and Crew LLP

(57) ABSTRACT

A decoder may perform node data reordering for bit node processing and node data reordering for bit node to check node interconnections. The decoder may also utilize a single barrel shifting operation on data read from an edge memory for bit node processing or check node processing during a memory read operation. The decoder may also utilize a single format conversion on data read from an edge memory for bit node processing or check node processing. The decoder may also utilize a simplified check node process for check node processing.

27 Claims, 7 Drawing Sheets

OTHER PUBLICATIONS

Tong Zhang, Keshab K. Parhi; An FPGA Implementation of (3,6)-Regular Low-Density Parity-Check Code Decoder; EURASIP Journal on Applied Signal Processing; 2003, Hindawi Publishing Corporation.*

Jinghu Chen and Marc P.C. Fossorier, "Density Evolution for BP-Based Decoding Algorithms of LDPC Codes and Their Quantized Versions", Department of Electrical Engineering, University of Hawaii, 5 pages, IEEE, 2002.

Edward Liao, Engling Yeo, Borivoje Nikolic, "Low-Density Parity-Check Code Constructions for Hardware Implementation" IEEE Communications Society, pp. 2573-2577, 2004.

* cited by examiner

DECODER ARCHITECTURE SYSTEM AND METHOD

This patent application claims the benefit of priority to U.S. Provisional Application Ser. No. 60/618,309, filed on Oct. 13, 2004, and Ser. No. 60/696,008, filed on Jul. 1, 2005, the entire disclosures of which are incorporated herein by reference.

BACKGROUND AND SUMMARY

The technology described herein generally relates to forward error correction (FEC) decoder architecture, and particularly relates to low-density parity-check (LDPC) decoding architecture.

Forward error correction (FEC) is a method of transmitting redundant information with transmitted data to allow a receiver to reconstruct the data if there is an error in the transmission. At a transmitter, a structured redundancy for the data is added in the form of some parity bits by encoding the data. This structured redundancy is exploited at the receiver by decoding to correct any errors introduced during transmission.

Some FEC coding schemes incorporate iterative decoding by a decoder Turbo codes and low-density parity-check (LDPC) codes are examples of coding schemes that may be iteratively decoded. The decoder in a receiver may be implemented in software, hardware, or by a combination of both hardware and software. Often a decoder is implemented by an application-specific integrated circuit (ASIC), field programmable gate arrays (FPGA), or other type of customized hardware. The performance of the decoder may be increased by designing an architecture to support particular decoding algorithms.

Disclosed herein is a novel decoder system and method for implementing an iterative decoder. The decoder system and method may include node data reordering for initial bit node processing and node data reordering for bit node to check node interconnections. The decoder system and method may also utilize a single barrel shifting operation on data read from an edge memory for bit node processing or check node processing during a memory read operation. The decoder system and method may also utilize a single format conversion on data read from an edge memory for bit node processing or check node processing. The decoder system and method may also utilize a simplified check node process for check node processing. These novel features and other novel features may be implemented separately or in combination in a decoding circuit.

DRAWINGS

DETAILED DESCRIPTION

Example embodiments of a novel decoder architecture are described herein with respect to LDPC codes and LDPC decoding. The novel decoder architecture, however, may be adapted for other FEC coding schemes that facilitate parallel decoding.

The concept of LDPC codes is generalized to all the linear block codes that can be represented by a sparse parity check matrix. These codes may be decoded using iterative soft-input soft-output (SISO) decoding. It is desirable to reduce the inherent latency of the iterative process to facilitate the processing of high-data rate communications. An iteration involves two processing stages—check node processing and bit node processing. During the check node processing stage, extrinsic information and parity bits involved in a parity check equation is gathered and new extrinsic information is calculated for all the related bits. During the bit node processing stage, the extrinsic information corresponding to the several parity check equations for any bit is combined to provide updated output information for the next iteration. In general, the information and parity bits may be referred to as bit nodes, and the parity check equations may be referred to as check nodes. The parity check matrix can be considered as a interconnection network between bit nodes and check nodes, and every connection is defined as an edge. During the iterative decoding process, every edge carries extrinsic information back and forth between the bit nodes and check nodes.

Figure 1:
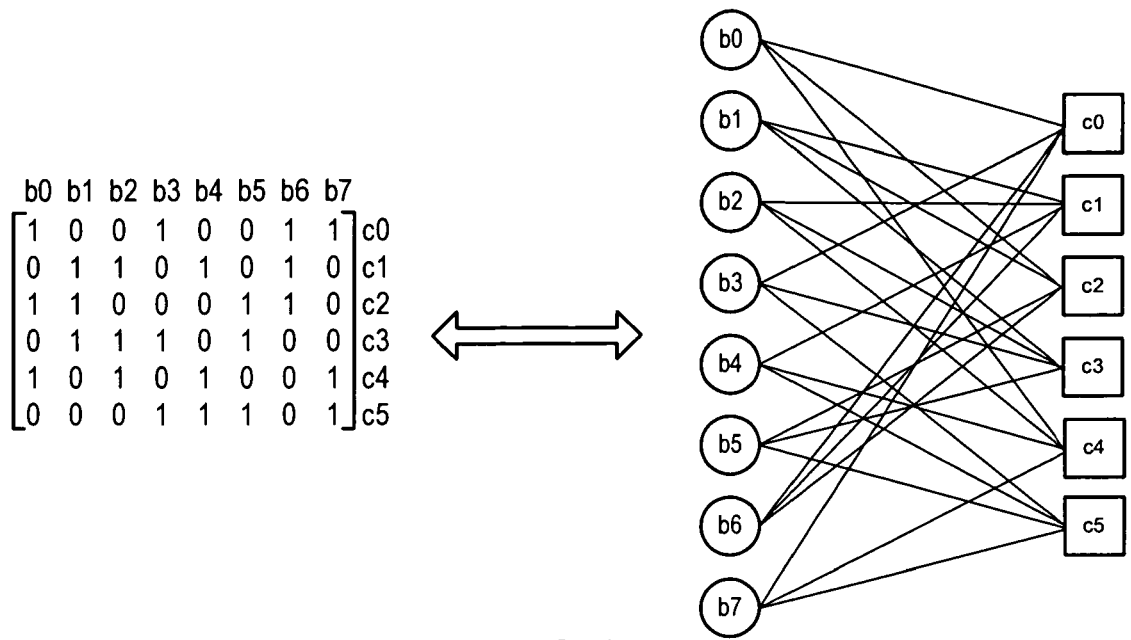
FIG. 1 is an sparse parity check matrix A and associated bipartite graph.

FIG. 1 is an example parity check matrix A and an associated bipartite graph. In the bipartite graph, each bit node b0-b7 represents a corresponding column in the parity check matrix A, and each check node c0-c5 represents a corresponding row in the parity check matrix A. The example parity check A is not an actual LDPC parity check matrix, and is provided for illustrative purposes only. Each "1" represents a bit involved in a parity check. Thus, for each code word $a=[a_0, a_1, \ldots a_7]$ received, the parity checks are based on:

$$a_0+a_3+a_6+a_7,$$

$$a_1+a_2+a_4+a_6, \ldots$$

etc. The received code word a may be represented by soft information, the values of which may be used to initialize a matrix according to the parity check matrix A for iterative decoding. For example, if the soft information generated from a received code word is [0.22, 0.17, 0.78, 0.80, 0.87, 0.10, 0.25, 0.33], then an initialized matrix X according to the parity check matrix of FIG. 1 would be:

$$\begin{bmatrix} 0.22 & & & 0.80 & & & & 0.25 & 0.33 \\ & 0.17 & 0.78 & & & 0.87 & & 0.25 & \\ 0.22 & 0.17 & & & & & 0.10 & 0.25 & \\ & 0.17 & 0.78 & 0.80 & & & 0.10 & & \\ 0.22 & & 0.78 & & & 0.87 & & & 0.33 \\ & & & 0.80 & 0.87 & 0.10 & & & 0.33 \end{bmatrix}$$

Each connection between a bit node and a check node is an edge, and corresponds to a "1" in the parity check matrix A. Because the parity check matrix A has a column weight of 3 and a row weight of 4, each bit node is connected to three edges and each check node is connected to four edges. During the iterative decoding process, each check node provides a bit node estimate to a bit node based on information from other related bit nodes. The bit nodes, in return, provide an estimate of its own value based on information from other related check nodes. The process continues until all parity check equations are satisfied, indicating a valid decode, or until a maximum number of iterations is reached without satisfying all parity check equations, indicating a decoding failure.

During decoding, a value is assigned to each edge of a bipartite graph that is representative of a channel value associated with a bit node to which the edge is connected. Check nodes are then updated by accumulating the edge values according to a log-likelihood G operation G:

$$G(a, b) = \ln\frac{1 + e^{a+b}}{e^a + e^b}$$

Bit nodes are thereafter updated with the update edge values by summing the edge values associated with the bit node. Thereafter, the system determines if all parity equations are satisfied or if a maximum number of iterations has been reached if all parity equations are not satisfied.

The interconnection between the bit nodes and check nodes in an LDPC code is typically pseudo-random. To facilitate high-speed decoding with reasonable complexity, a structure is often imparted in the code design so that the connections to the check nodes for a group of bit nodes are a linear translation of each other, i.e., some or all of the parity equations may be a linear translation of one particular parity equation. For example, a parity check matrix may define the following sets of linearly shifted parity check equations (1) and (2):

$$a_0 + a_8 + a_{16} + a_{32} = 0, \quad (1)$$
$$a_1 + a_9 + a_{17} + a_{33} = 0,$$
$$a_2 + a_{10} + a_{18} + a_{34} = 0 \ldots$$
$$a_0 + a_{10} + a_{20} + a_{30} = 0,$$
$$a_1 + a_{11} + a_{21} + a_{31} = 0,$$
$$a_2 + a_{12} + a_{22} + a_{32} = 0 \ldots \quad (2)$$

etc. Thus in the linearly shifted parity check equation (1), operands $a_0$, $a_1$ and $a_2$ correspond to the first operand $a_p$, operands $a_8$, $a_9$ and $a_{10}$ correspond to the second operand $a_{p+8}$, and so on. Such a code structure facilitates parallelizing the decoding process.

Memory presents unique implementation challenges. Multiple bits of soft-extrinsic information for all the edges between bit nodes and check nodes must be accommodated and stored. The memory for storing such information is often referred to as edge memory. Additionally, during the iterative decoding process the bit node processors require the original soft-input from the channel. Thus, a double buffer is typically used to facilitate the storage of new data while iteratively decoding received data. The size of the memory depends on the block size, the resolution of soft-information and also the average number of edges per bit, and may be relatively large for large block code sizes. Additionally, a highly-parallel decoder will read from and write to memory stores in a highly parallel fashion. Thus for a degree of parallelism "p" the decoder must be able to read and write p blocks of information at a time from these memories. For example, the sets of linearly shifted parity check equations (1) and (2) above define a first degree of parallelism p and a second degree of parallelism p. The values of p may differ for each degree of parallelism, e.g., the first degree of parallelism p may be 8, and the second degree of parallelism may be 16. The values of p may also be the same for some or all degrees of parallelism.

Figure 2:
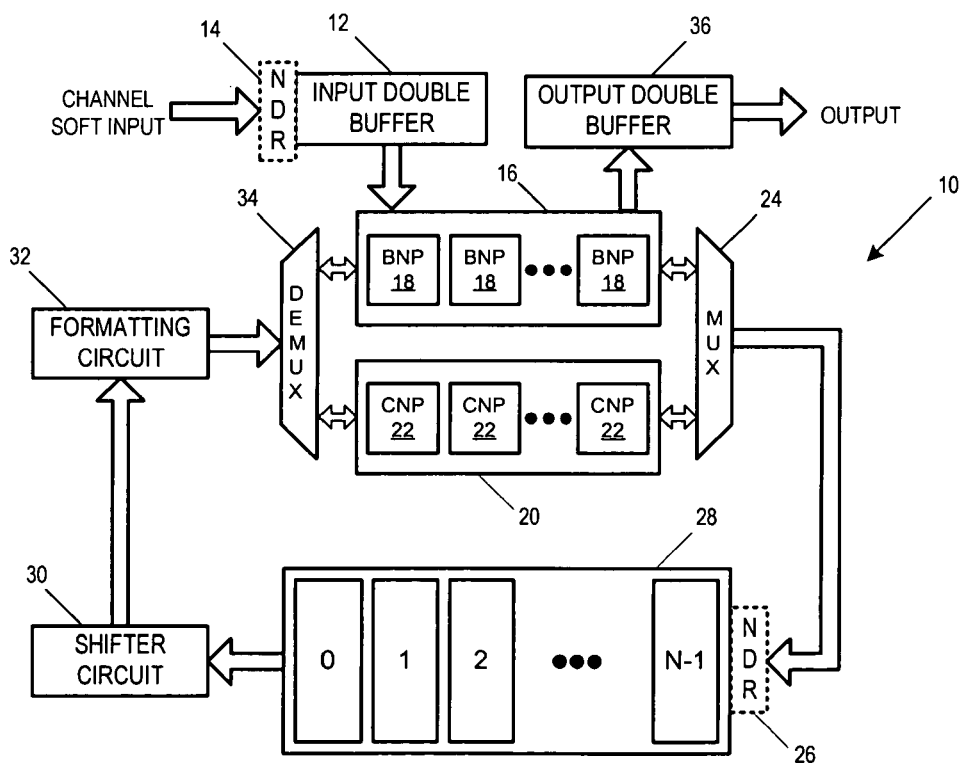
FIG. 2 is an example decoder architecture.

A novel architecture for FPGA or ASIC implementations of an LDPC decoder is presented herein. The architecture may be applied to a variety of LDPC code structures to achieve highly parallel and highly efficient LDPC decoding. FIG. 2 is an example decoder architecture 10 that implements the novel systems and methods disclosed herein.

An input double buffer 12 is configured to store channel soft input. A bit node processing block 16 comprises a plurality of bit node processors (BNPs) 18, and a check node processing block 20 comprises a plurality of check node processors (CNPs) 22. Data from the bit node processing block 16 or check node processing block 20 is provided to an edge memory bank 28 via a multiplexor 24 for storage. Data stored in the edge memory 28 is provided to the bit node processing block 16 or check node processing block 20 for processing via a shifter circuit 20, a formatting circuit 32, and a demultiplexor 34. Output data is stored in an output double buffer 36.

Based upon the particular LDPC code structure to which the decoder architecture 10 is designed, data is placed into and read out of memory in an ordering that allows for highly parallel decoding. This is referred to as node data reordering.

Node data reordering may be implemented for initial bit node processing and may also be implemented for the bit node to check node interconnections. In the example decoder architecture 10 of FIG. 2, node data reordering is implemented to reorder the data stored in the input double buffer 12 that is input into the bit node processing block 16. In the example embodiment shown, node data reordering for initial bit node processing is implemented by node data reordering circuitry 14 coupled to the input double buffer 12. Other implementations of node data reordering may also be used, such as a selectively storing the data into the input double buffer 12, or implementing a particular data bus design for the channel soft input, etc.

Data is read out of the input double buffer 12 during bit node processing. In the example decoder architecture 10 of FIG. 2, for each degree of parallelism p there is a set of p corresponding parallel bit node processors 18 in the bit node processing block 16. Again, the values of p for each degree of parallelism may be the same or different, depending on the corresponding parity check matrix. The information bits are arranged in sets of $(0, 1, \ldots (p-1))$, $((p), (p+1), \ldots (2p-1))$ and so on. The parity bits, however, may require an alternative arrangement. For example, in the case of double-diagonal structured LDPCs, every parity bit is involved in two parity check equations, i.e., every parity bit is connected to two different check nodes. For example, the first parity bit may be connected to the first check node and the second check node, and the second parity bit may be connected to the second check node and the third check node, and so on. In such a case to facilitate p bit node processors 18 in parallel, the parity bits are arranged in sets of (0, (NP/p), . . . ((p−1)NP/p)), (1, (NP/p+1), . . . , ((p−1)NP/p+1)), and so on, where NP is the number of parity bits.

In one example embodiment, the node data reordering for the bit node processing block 16 stores corresponding data for each linearly shifted data in a single addressable memory location in the input double buffer 12. The single memory location, in turn, is connected to corresponding parallel bit node processors. For example, for the linearly shifted parity check equations (1) above, a first three-byte addressable memory location stores the data for $a_0$, $a_1$, and $a_2$ in the first, second and third bytes; a second memory location stores the data for $a_8$, $a_9$, and $a_{10}$; a third memory location stores the data for $a_{16}$, $a_{17}$, and $a_{18}$; and a fourth memory location stores the data for $a_{32}$, $a_{33}$, and $a_{34}$. Thus, during bit node processing, each memory location may be addressed during an addressing cycle and the stored data may be provided to three correspond bit node processors 18 in parallel, the first bit node processor 18 receiving the first byte of data, the second bit node processor 18 receiving the second byte of data, and the third bit node processor 18 receiving the third byte of data. During the next processing cycle, e.g., a clock cycle, the three correspond bit node processors 18 may receive the data stored in the second memory location, and so on. Such node data reordering for each set of linearly shifted parallel data ensures uninterrupted data flow to the parallel bit node processors.

Data from the bit node processing block 16 is routed to an edge memory block via a multiplexor 24. In the example decoder architecture 10 of FIG. 2, node data reordering for bit node to check node interconnections is implemented to reorder the data input into the edge memory bank 28. Similar to the input double buffer 12, the edge memory 28 is partitioned to store the edge data to facilitate parallel processing. As both the bit node processors 18 and check node processors 22 utilize the edge memory, data needs to be stored such that parallelism in both the operations can be supported. In the decoder architecture 10 of FIG. 2, data for the edges for a check node processor 22 are stored together so that the address generator may be realized by a counter while performing check node processing, e.g., a counter address generator may be used. To facilitate a degree of parallelism p, the corresponding edge memory 28 block must be wide enough to support one input for each of the p parallel check node processors 22.

While this storage arrangement is sufficient to regulate the data flow in check node processing, the connection between bit nodes 18 and the check nodes 22 is pseudo-random and thus may complicate the reading and writing of data while performing bit node processing. Thus, the decoder architecture 10 of FIG. 2 implements node data reordering that is based on the linear translations of the bit nodes to the check nodes interconnections. The check node processors 22 corresponding to the p bit node processors 18 that have their connections as linear translation of each other are arranged for simultaneous read and write operations on the edge memory 28. Thus, during bit node processing only one block of the edge memory 28 needs to be written to or read from for the p parallel processing operations. Because the data is thus arranged at continuous addresses for check node processing, the bit node processing utilizes a pseudo-random address access as defined by the bit node to check node interconnections to read the edge data for a bit node processing cycle.

In the example embodiment shown in FIG. 2, the node data reordering for the bit node to check node interconnections is implemented by node data reordering circuitry 26 interposed between the multiplexor 24 and the edge memory 28. Other implementations of node data reordering for bit node to check node interconnections may also be used, such as a selectively storing the data into the edge memory 28, or implementing a particular data bus design for the between the multiplexor 24 and the edge memory 28, etc.

For a given degree of parallelism p, the data read out of the edge memory 28 will be p wide; however a barrel shifting of the data may be required for bit node processing to provide the data to the corresponding bit node processor 18. Typically random barrel shifting is first performed to provide the data to the bit node processors 18 and is again performed to write the data back into the edge memory 28 to facilitate later check node processing. In addition to requiring an additional shifting circuit, this process also increases latency due to the additional shifting operation.

In the example decoder architecture of FIG. 2, however, the shifter circuit 30 performs barrel shifting to provide the resultant data from check node processing to the bit node processors 18. The data is then written back to the edge memory 28 without further barrel shifting, and the shifter circuit 30 is further configured to perform an inverse barrel shifting when reading data for check node processing from the edge memory 28. Thus only a single shifting circuit 30 is required.

Figure 3:
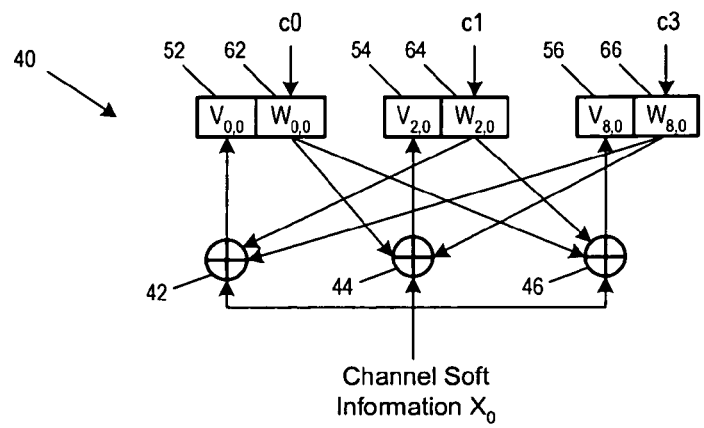
FIG. 3 is an example bit node processor architecture.

FIG. 3 is an example bit node processor architecture 40. Bit node summers 42, 44 and 46 receive channel soft information $X_0$ and provide the data to bit node stores 52, 54 and 56. Each bit node store 52, 54 and 56 corresponds to a bit node output. Thereafter, check node stores receive check node values from check node processing. Bit node processing thereafter involves generating the extrinsic information for any edge going from a bit node as a summation of the channel information and all the other edges connected to that bit node. The edge values coming into a bit node summer 42, 44 and 46 are summed with the original soft channel information $X_0$. Extrinsic information output for a particular edge is generated by subtracting the original extrinsic information from the newly summed edge value of that edge. Because only simple addition and subtraction operations are used in bit node processing, a 2's complement data format is suitable for bit node processing.

Figure 4:
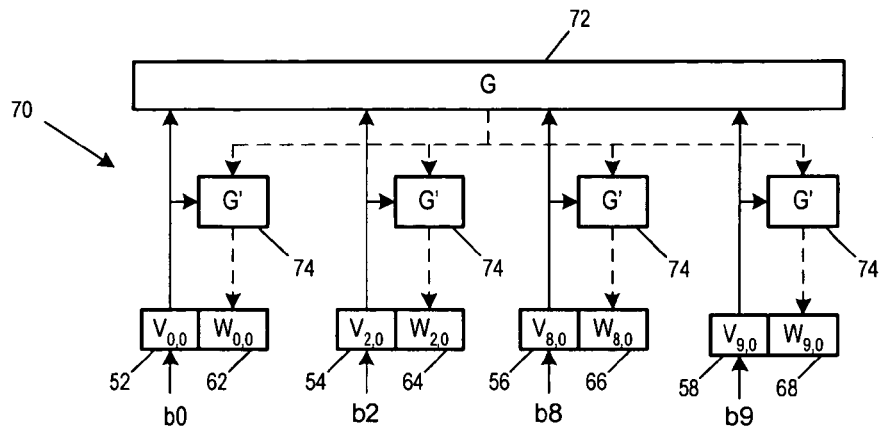
FIG. 4 is an example check node processor architecture.

FIG. 4 is an example check node processor architecture 70. Check node processing is similar in concept to bit node processing, except that check node processing involves the accumulation of values based on the log-likelihood operation G and its inverse G', where $$G(a, b) = \ln\frac{1 + e^{a+b}}{e^a + e^b}, \text{ and } G'(a, b) = \ln\frac{1 - e^{a+b}}{e^a - e^b}.$$

Bit node data from bit node data stores 52, 54, 56 and 58 are provided to a G processing block 72. For any edge, the output extrinsic information is equal to the G summation of the incoming extrinsic information on all the other edges. For example, in FIG. 1, the output extrinsic information for the edge connecting bit node b0 to check node c0 is the summation of the edges between check node c0 and bit nodes b3, b6 and b7. Likewise, the output extrinsic information for the edge connecting bit node b3 to check node c0 is the summation of the edges between check node c0 and bit nodes b1, b6 and b7, and so on.

Extrinsic information output for an edge is generated by subtracting its incoming information from the accumulated information via a G' processing block 74. At any check node processor, the data for the different edges can be provided serially for a pipelined implementation or in batches for a parallel implementation.

Figure 5:
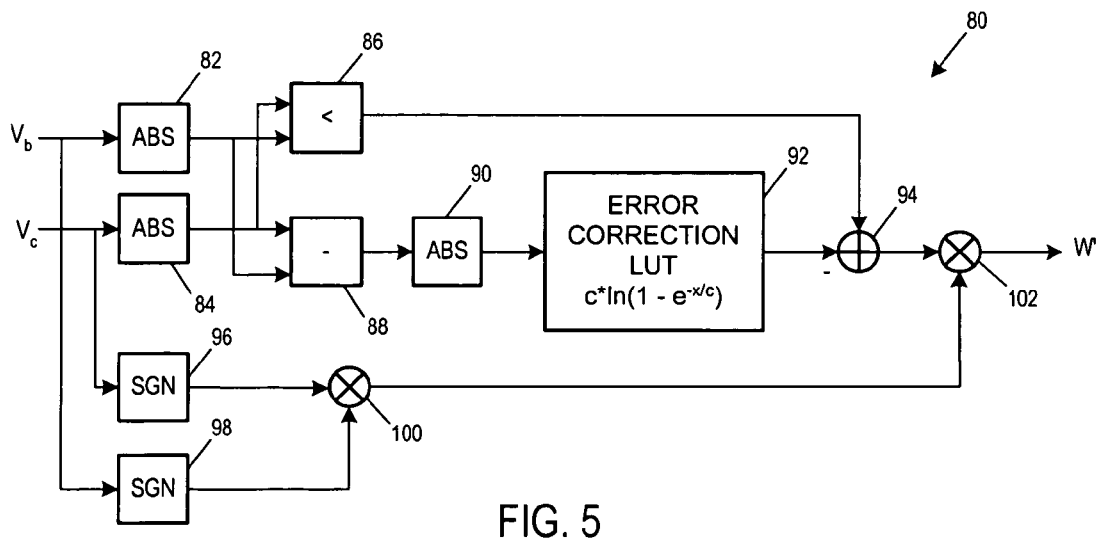
FIG. 5 is an implementation of a G operation in a check node processor.

Both the G and G' operations comprise the logarithmic functions as described above. A simplified version of the exact mathematical equations may be used for hardware implementation. FIG. 5 is an implementation 80 of a G operation in a check node processor. Similar circuitry may be used to implement the G' operation.

Check node data $V_b$ and $V_c$ comprises 2's complement data and is provided to absolute value converters 82 and 84 which output the absolute values of Vb and $V_c$. The difference between the absolute values $V_b$ and $V_c$ is determined by processing block 88 and converted to an absolute value by absolute value converter 90. An error correction processor 92 receives the output of the absolute value converter 90. The error correction processor 92 comprises a look-up table (LUT) that outputs an error correction value from a look-up based on the input from the absolute value converter. The smaller of $V_b$ and $V_c$ is selected by a processing block 86 and the difference between the selected value and the error correction value is determined by summer 94.

Check node data $V_b$ and $V_c$ is also converted to sign-magnitude data format by sign magnitude converters 96 and 98, and thereafter multiplied by multiplier 100. The output of the G operation is then generated by multiplying the output of the summer 94 and the multiplier 100.

As check node processing involves dealing with signs of different numbers and absolute values, a suitable data format is the sign-magnitude format. Because bit node processing operates on 2's complement data, the changing of the data format is required between bit node processing and check node processing. Typically data is stored in 2's complement and only changed to sign magnitude when performing check node processing. Thus when data is continuously being processed in a pipeline, a 2's complement to sign-magnitude format changer is required at the input of the check node processing block and a sign-magnitude to 2's complement format changer is required at the output of the check node processing block.

In one embodiment, the decoder architecture 10 of FIG. 2 only includes a single formatting circuit 32 interposed between the shifter circuit 30 and the demultiplexor 34. When 2's complement data is read out of the edge memory 28 for check node processing, the formatting circuit 32 changes the format of the data from 2's complement format to sign-magnitude format. The sign-magnitude data from the resulting check node processing is thereafter written back to the edge memory 28 in sign-magnitude format. Similarly, when sign-magnitude data is read out of the edge memory 28 for bit node processing, the formatting circuit 32 changes the format of the sign-magnitude data from sign-magnitude format to 2's complement format. The 2's complement data from the resulting bit node processing is thereafter written back to the edge memory 28 in 2's complement format. In one embodiment, the data may be limited to ranges of {−31,+31} or {−63,+63} so that both conversions require the same data operations and thus a single data format changing circuit within the formatting circuitry 32 can be used.

A device for performing soft-input, soft-output (SISO) decoding that utilizes the decoder architecture 10 of FIG. 2 will require an initialization at the beginning of the decoding process and a hard-decision at the end of the decoding processing. Decoding requires that the edge memory 28 should be initialized with the channel soft-input information $X_0$. This requires that all the edges connected to a bit node should have the same value as the channel soft-input for that bit node, such as described with respect to the initialized matrix X above. To accomplish this initialization, the decoder architecture 10 of FIG. 2 first initializes the edge memory in an all-zero state at the beginning of decoding a block of received data. Thereafter, a bit node processing stage is performed to initialize the edge memory 28 appropriately. Because the check node values are zero, the edge memory 28 is appropriately initialized with the soft channel information. Accordingly, this bit node processing half-iteration eliminates the need for any special initialization circuitry for the edge memory 28.

Assuming there is a valid decode, the last state of the decoding process involves a hard-decision decode. The decoding architecture 10 of FIG. 2 may also include a modified bit node processing employed during the final stage of decoding iterations to obtain the hard-decision decoded data. During the last iteration, all of the edge information coming into a bit node processor 18 is added together with the original channel soft input for that bit to generate the accumulated information. However, instead of performing a subtraction operation, a hard-decision is performed based on the accumulated information to decide if the decoded bit is a 0 or a 1. This hard-decision data is then stored in the output double buffer 36. Thus the final bit node processing sums the edge information coming into a bit node with the original channel soft input and then performs a hard-decision on the sum to determine if the decoded bit is a 0 or 1.

In another embodiment, the decoding architecture 10 of FIG. 2 comprises reduced-complexity check node processors 22. Typically, the error correction factor calculation performed by the error correction circuitry 92 is implemented using a look-up table. Thus every check node processor 22 requires additional memory resources to perform the error correction factor calculations for the G and G' operations.

Figure 6:
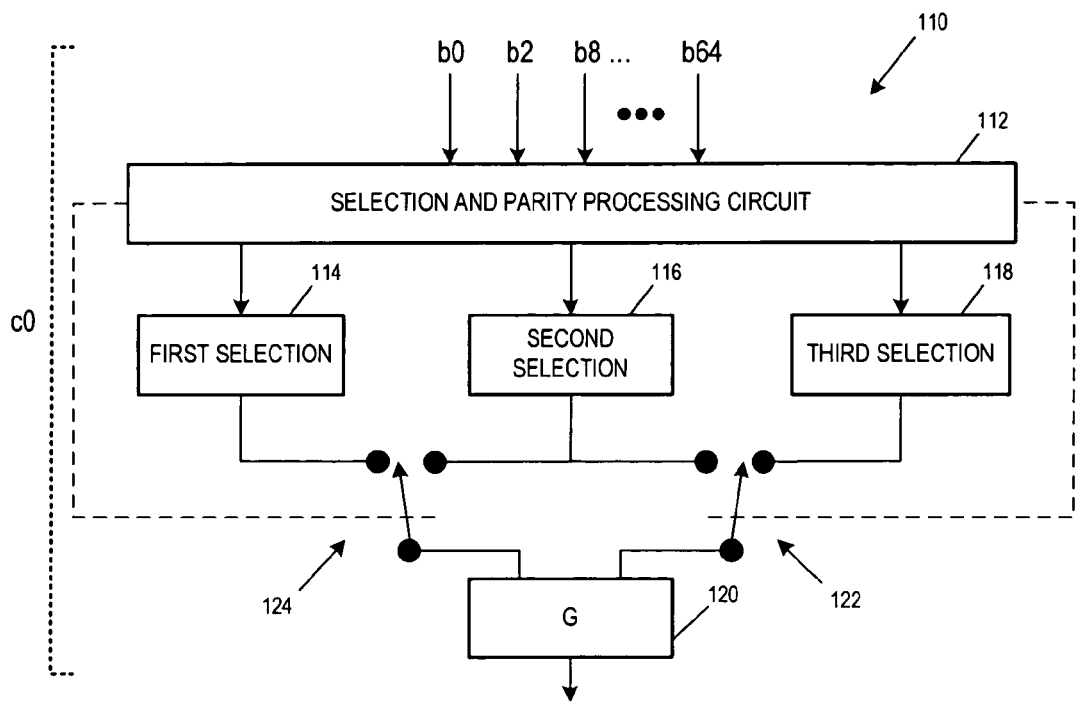
FIG. 6 is an example simplified check node processor architecture.
Figure 7:
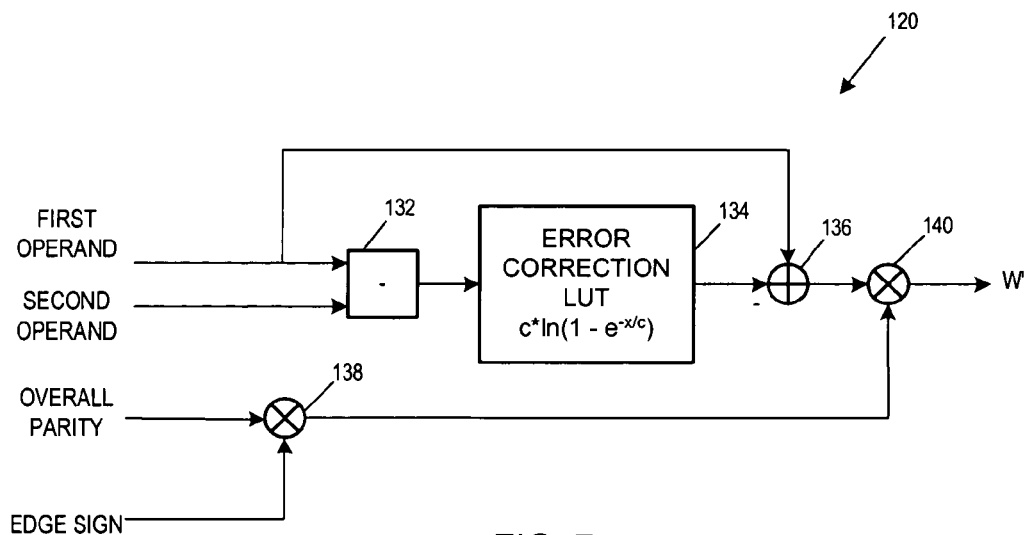
FIG. 7 is an implementation of a G operation in the simplified check node processor architecture.

FIGS. 6 and 7 provide a simplified logic based implementation for check node processing. In particular, FIG. 6 is an example simplified check node processor architecture 110, and FIG. 7 is an implementation of a simplified G operation in the simplified check node processor architecture 110.

The simplified check node processor architecture 110 incorporates an algorithm that facilitates simplification of check node processing in LDPC decoding. Accumulations via the G operation yield a result that is dominated by smaller input values. The decoding algorithm is based on log likelihood ratios that are, in turn, based on logarithms of probability calculations. Thus the multiplication or division of probabilities involve simple additions or subtractions of the log likelihood ratios. Addition or subtraction of the log likelihood ratio values, however, requires special accumulation functions in the logarithmic domain. Depending upon the exact nature of the calculations, these accumulation functions have the tendency of being dominated by a small group of operands. The G operation is one such operation that has the tendency to produce an output dominated by a small subset of operands. In particular, the G operation has the tendency of producing an output that is dominated by the smaller of the input values.

The tendency of the G operation to produce an output dominated by the smaller input values can be exploited by incorporating a decoder method that reduces decoder complexity. In this decoding method a forward pass through the input values is reduced to a selection process. The selection process identifies the operands among the incoming data that are likely to dominate the results of the operation. The selection process includes a selection criterion that defines how the selections are made, and a selection value that defines how many selections are made.

The selection criterion comprises a property or metric that depends on the particular operation being simplified. For example, in some cases the magnitude of the operands may be of primary interest, and thus the selection is made based on only the few smallest or largest values. Likewise, in some cases polarity may be the primary interest. For the simplified check node processor architecture 110 of FIG. 6, the selection criterion is based on the smallest magnitudes of the input values, as the output of the G operation is dominated by these smaller input values.

The selection value reflects a trade-off between implementation complexity and accuracy. The actual trade-off depends upon the operation, but in general increasing the number of selections results in increased accuracy and better performance while also leading to increased computational complexity. For the G operation, a selection value of three has been found to be acceptable. Other selection values may also be used.

The simplified check node processing architecture 110 of FIG. 6 included a selection and parity processing circuit 112 that selects three operands from the edges corresponding to a check node based upon the specified selection criterion, i.e., based upon the smallest magnitudes, and obtains an overall parity of the incoming data by an exclusive-OR (XOR) operation performed on the incoming edge data. The magnitudes of the selections are stored in a first selection data store 114, a second selection data store 116, and a third selection data store 118. For example, assume edge data for a plurality of edges corresponding to bit nodes b0, b2, b8, b16, b32, and b64 are connected to the check node c0 of FIG. 6. If the edge value b0 has the smallest magnitude, and b8 the next smallest magnitude, and b64 the third smallest magnitude, then the magnitudes of these values are respectively stored in the first, second and third selection data stores 114, 116 and 118, respectively.

After the three operands are selected and stored, a subject edge value is compared to the values stored in the first and second selection data stores 114 and 116 for processing of the subject edge value. If the subject edge value is equal to the magnitude of the value stored in the first selection data store 114, then a G processing block 120 receives the values stored in the second and third selection data stores 116 and 118 to generate the output extrinsic information magnitude for the subject edge value. If the subject edge value is equal to the magnitude of the value stored in the second selection data store 116, then the G processing block 120 receives the values stored in the first and third selection data stores 114 and 118 to generate the output extrinsic information magnitude. For any other condition, the G processing block 120 receives the values stored in the first and second selection data stores 114 and 116 to generate the output extrinsic information magnitude. The inputs into the G processing block 120 may be routed by switches 122 and 124.

For example, if the first, second and third selection data stores 114, 116 and 118 respectively store edge values for the edge between the check node c0 and a plurality of edges corresponding to bit nodes b0, b2, b8, b16, b32 and b64, then the following inputs to the G operation for a subject edge are as follows:

TABLE 1

| G Inputs for Subject Edges in Simplified G Accumulation | |
| --- | --- |
| Subject Edge | G Inputs |
| b0 | b8, b64 |
| b8 | b0, b64 |
| b2, b16, b32, b64 | b0, b8 |

Thus the first operand into the G processing block 120 is always the first selection or the second selection (if the edge value is equal to the first selection, then the first operand is the second selection, otherwise the first operand is the second selection). Likewise, the second operand into the G processing block 120 is always the second selection or the third selection (if the edge value is equal to the first or second selection, then the second operand is the third selection, otherwise the second operand is the second selection). Accordingly, the magnitude of the output extrinsic information is a G summation of two of the three values stored in the first, second and third data stores 114, 116 and 118 for each subject edge.

Because the first operand into the G processing block 120 is always smaller than the second operand, the comparison circuitry of the G processor of FIG. 5 is not required. Accordingly, the simplified G processing block 120 of FIG. 7 may be used. The difference between the first and second operands is determined by processing block 132 and provided to an error correction processor 134. The error correction processor 134 comprises a look-up table (LUT) that outputs an error correction value from a look-up based on the input from the processing block 132. The difference between the first value and the error correction value is determined by a summer 136. The sign of the output of the simplified G operation is determined by an XOR of the overall parity with the sign of the existing edge value by XOR circuit 138. The output of the simplified G operation is then generated by multiplying the output of the summer 126 with the output of the XOR circuit 138 by multiplier 140.

Furthermore, a system implementing the simplified check node processing architecture 110 of FIGS. 6 and 7 need not implement a separate G' operation processing block, and each subject edge value is generated by the simplified G operation. This further simplifies implementation requirements.

Figure 8:
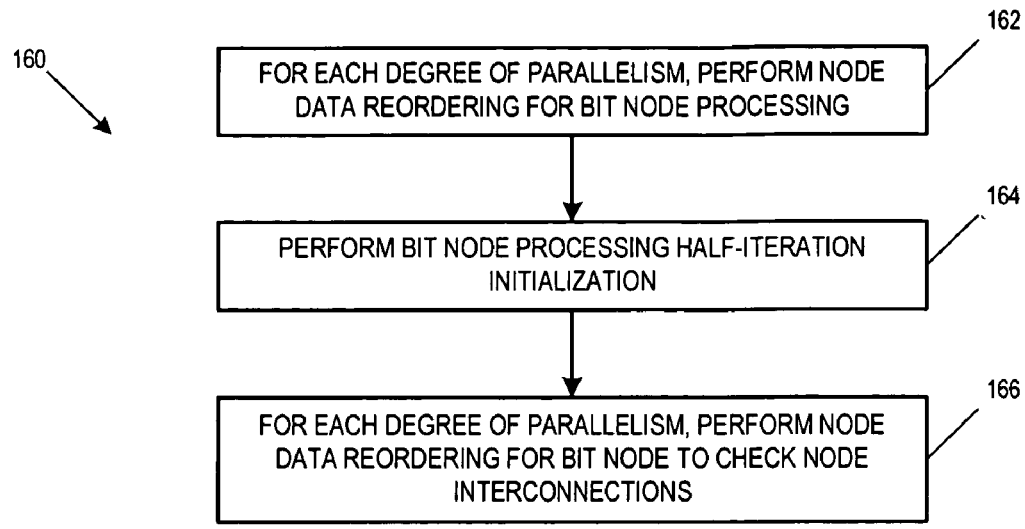
FIG. 8 is a flow diagram illustrating an example decoding process utilizing node data reordering.

FIG. 8 is a flow diagram 160 illustrating an example decoding process utilizing node data reordering. Step 162 performs node data reordering for the bit node processing for each identified degree of parallelism p. Step 164 performs an initialization by performing a bit node processing half-iteration. The initialization ensures that the edges connected to a bit node have the same value as the channel soft-input for that bit node. Step 166 performs node data reordering for the bit node to check node interconnections for each degree of parallelism p.

Figure 9:
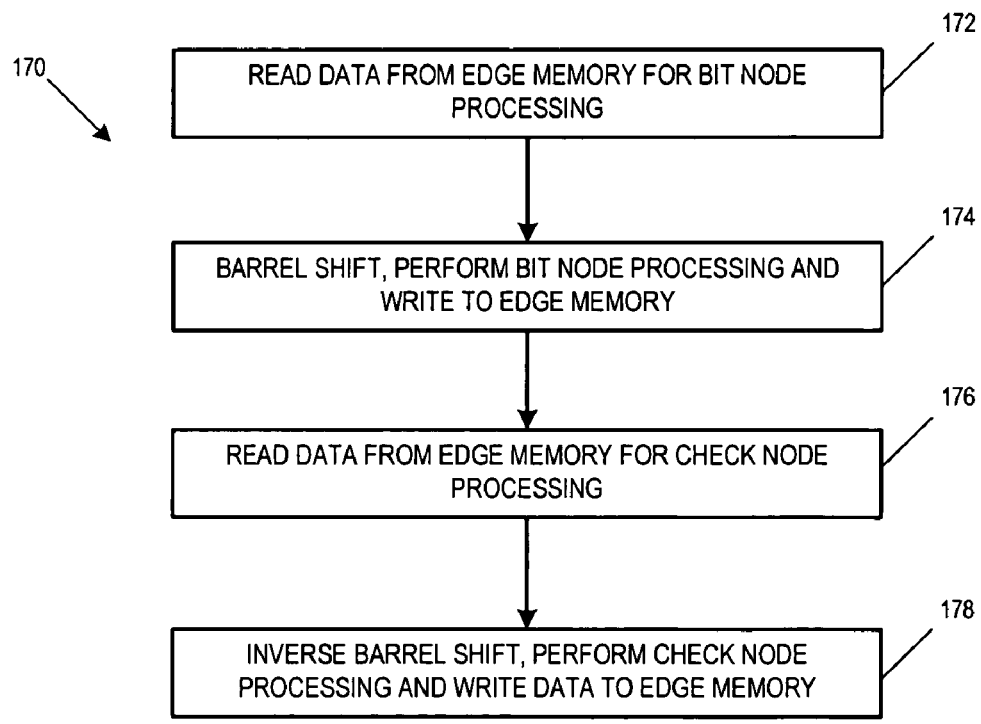
FIG. 9 is a flow diagram illustrating an example decoding process utilizing a single barrel shifting operation.

FIG. 9 is a flow diagram 170 illustrating an example decoding process utilizing a single barrel shifting operation. Step 172 reads data from the edge memory for bit node processing. Step 172 performs a barrel shift on the data, performs bit node processing and writes the data to the edge memory. Step 174 reads the data from edge memory for check node processing. Step 178 performs an inverse barrel shift on the data, performs check node processing, and writes the data to the edge memory. The process of the flow diagram 170 may be repeated during decoding iterations.

Figure 10A:
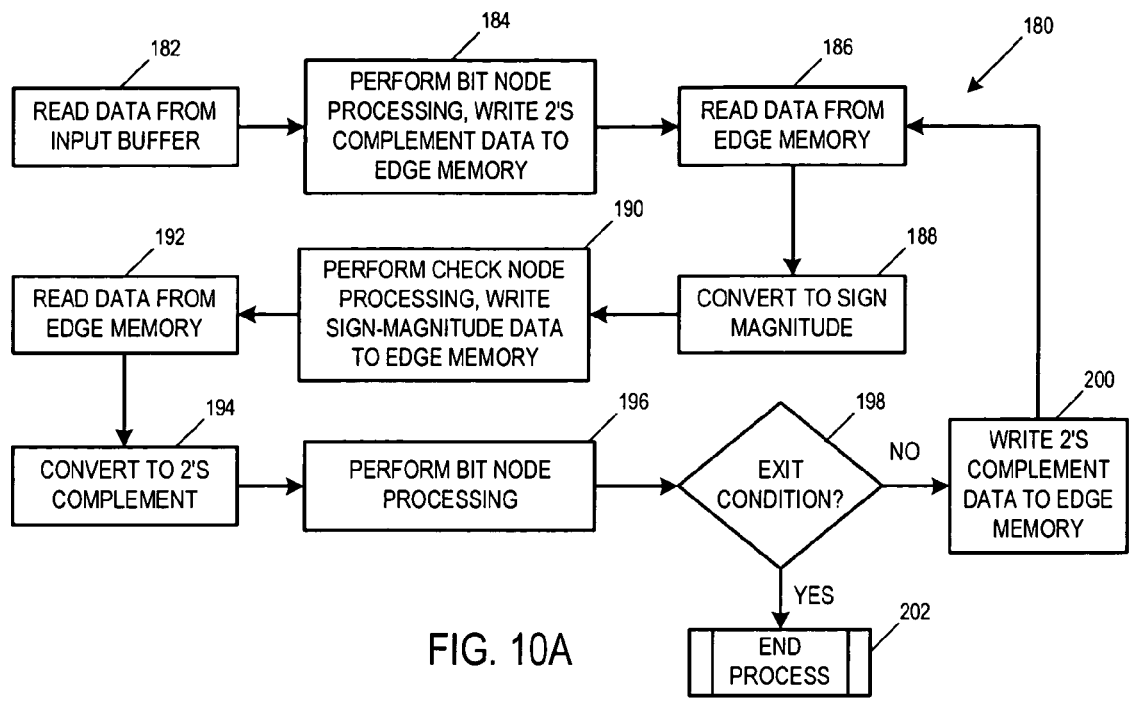
FIGS. 10A and 10B are flow diagrams illustrating example decoding processes utilizing a single format conversion operation.

FIG. 10A is a flow diagram 180 illustrating and example decoding process utilizing a single format conversion operation. The single format conversion operation is an operation that converts edge data into 2's complement or sign-magnitude format during a single operational processing stage, e.g., after a memory read operation.

Step 182 reads data from the input buffer, and step 184 performs bit node processing and writes the 2's complement data to the edge memory. Thereafter, steps 186-200 perform iterative decoding by sequential check node processing and bit node processing. Step 186 reads data from the edge memory, and step 188 converts the data to sign magnitude form. Step 190 performs check node processing and writes the sign-magnitude data to the edge memory. Step 192 reads the data from edge memory, and converts the data to 2's complement form. Step 196 performs bit node processing. Step 198 then determines if an exit condition has occurred, e.g., a valid decode or a maximum iteration. If an exit condition has not occurred, then step 200 writes the 2's complement data to the edge memory, and the process returns to step 186. If, however, an exit condition has occurred, then step 202 executes an end process, such as a hard-decision decode if a valid decode has occurred or an error process is a maximum iteration has been reached.

Figure 10B:
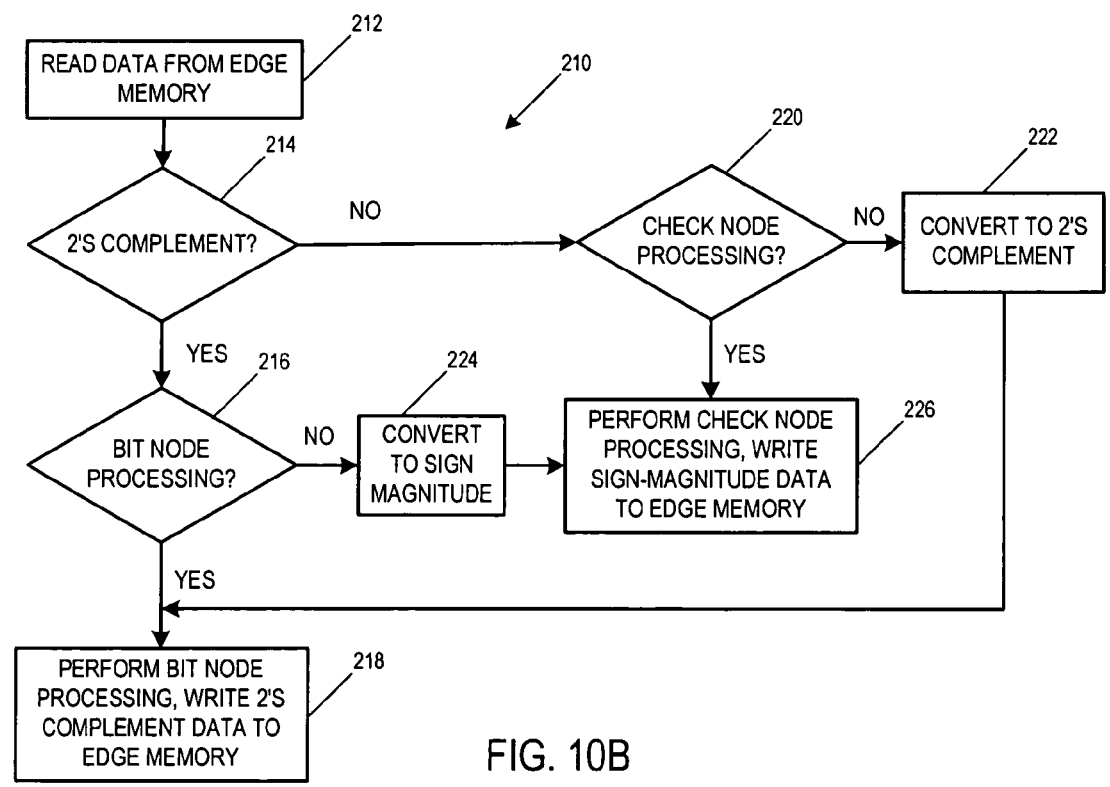

FIG. 10B is a flow diagram 210 illustrating another example decoding process utilizing a single format conversion operation. In this embodiment, decision processes determine whether a data conversion is needed. Step 212 reads data from the edge memory, and step 214 determines if the data is in 2's complement form. If the data is in 2's complement form, then step 216 determines if bit node processing is to be performed. If bit node processing is to be performed, then step 218 performs the bit node processing and writes the resulting 2's complement data to the edge memory. If bit node processing is not to be performed, then step 224 converts the data to sign magnitude form, and step 226 performs check node processing and writes the resulting sign-magnitude data to the edge memory.

If, however, the data read in step 212 was not 2's complement data, then step 220 determines if check node processing is to be performed. If check node processing is to be performed, then step 226 is executed. If check node processing is not to be performed, then the data is converted to 2's complement form in step 222 and step 218 is then performed.

Figure 11:
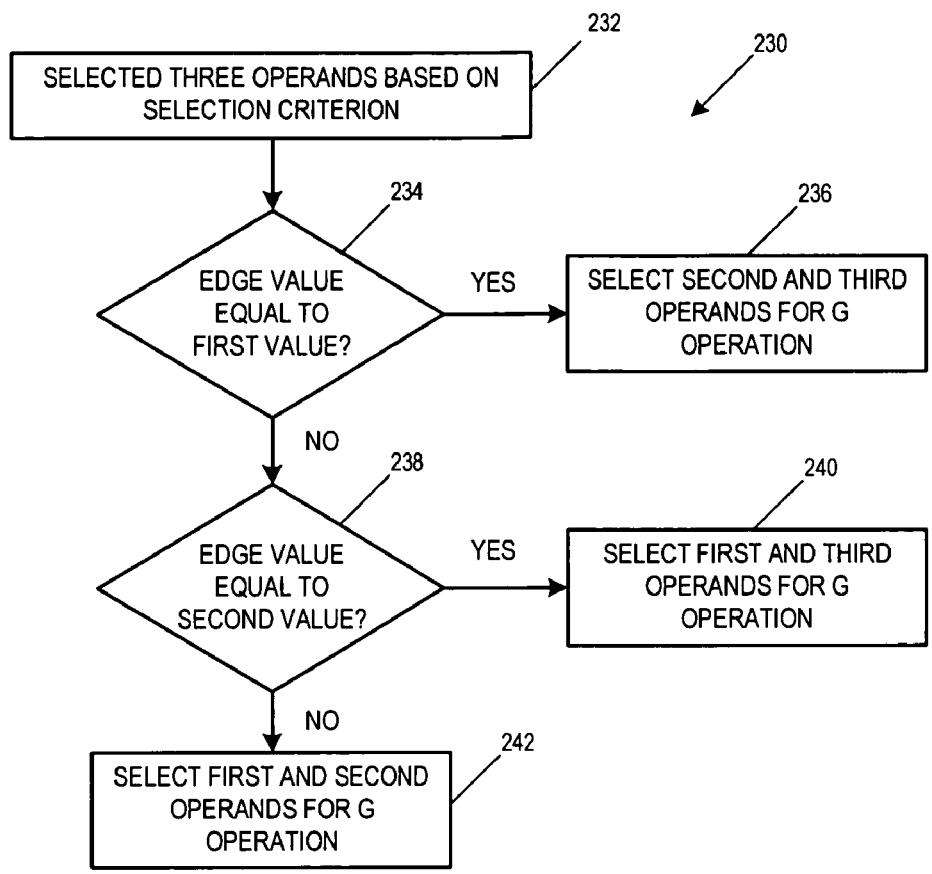
FIG. 11 is a flow diagram illustrating an example decoding process utilizing a simplified check node process.

FIG. 11 is a flow diagram 230 illustrating an example decoding process utilizing a simplified check node process. Step 232 selects three operands based on a selection criterion. For example, for a G operation, a selection criterion may be the three smallest magnitude values, and the three smallest magnitude may be stored in ascending order in first, second and third data stores. Step 234 determines if a subject edge value is equal to the first selected value. If the subject edge value is equal to the first selected value, then step 236 selects the second and third operands for the G operation. If the subject edge value is not equal to the first selected value, the step 238 determines if the subject edge value is equal to the second selected value. If the subject edge value is equal to the second selected value, the step 240 selects the first and third operands for the G operation. If the subject edge value is not equal to the first selected value, then step 242 selects the first and second operands for the G operation. The G operation then determines the new subject edge value.

The simplified check node processor architecture 110 of FIG. 6 allows for the elimination of the G' operation and corresponding circuitry. However, the G' may also be eliminated without the simplified check node processor architecture 110 by performing three separate G accumulation processes. The first G accumulation process comprises a G accumulation of edge values in a forward pass and storing the forward pass accumulated values at every step in the forward pass. The second G accumulation process comprises a G accumulation of edge values in a reverse pass and storing the reverse pass accumulated values at every step in the reverse pass. To obtain the new extrinsic information for a subject edge, G operations are performed on the forward pass accumulated values and the reverse pass accumulated values just before and after the edge.

For example, assume a check node c0 has edges to bit node b0, b2, b4 and b8. The forward pass accumulations are G accumulations of b0; b0, b2 (b02); b0, b2, b4 (b024); and b0, b2, b4, b8 (b0248). Likewise, the reverse pass accumulations are b8, b84, b842, and b8420. New extrinsic information for a subject edge is thus calculated as follows:

TABLE 2

| G Inputs for Subject Edges In 3-G Accumulation | |
|---|---|
| Subject Edge | G Accumulation/ G Inputs |
| b0 | b842 |
| b2 | b0, b84 |
| b4 | b02, b8 |
| b8 | b024 |

Note that the first subject edge b0 is equal to the reverse pass accumulation b842 and the last subject edge b8 is equal to the forward pass accumulation b024. The remaining middle edges b2 and b4 are obtained from G accumulations of the reverse pass and forward pass values.

Such a process may be readily facilitated by a pipeline implementation. Data may be provided serially during the check node processing and the first, second and third selections may be updated accordingly during a forward pass processing block. When the forward pass is completed, the selections can be passed to reverse pass processing block to perform the output calculation, and the forward pass processing block can start processing on the next set of inputs.

Figure 12:
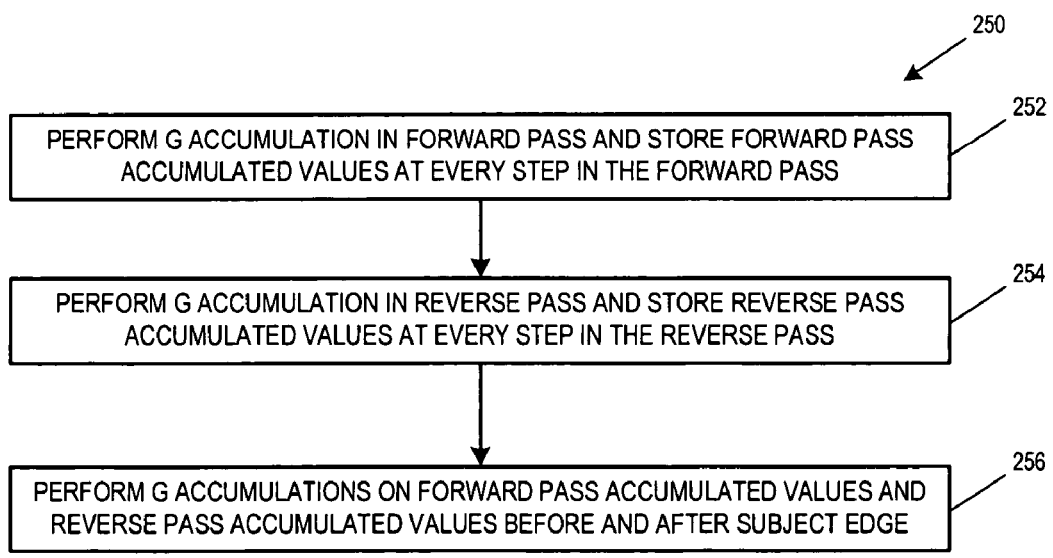
FIG. 12 is a flow diagram illustrating an example decoding process utilizing a single G operation.

FIG. 12 is a flow diagram 250 illustrating an example decoding process utilizing a single G operation. Step 252 performs a G accumulation in a forward pass and stores the forward pass accumulated values at every step in the forward pass. Step 254 performs a G accumulation in a reverse pass and stores the reverse pass accumulated values at every step in the reverse pass. Step 256 performs G accumulations on the stored forward pass accumulated values and the stored reverse pass accumulated values before and after a subject edge to generate new extrinsic information for the subject edge.

Figure 13:
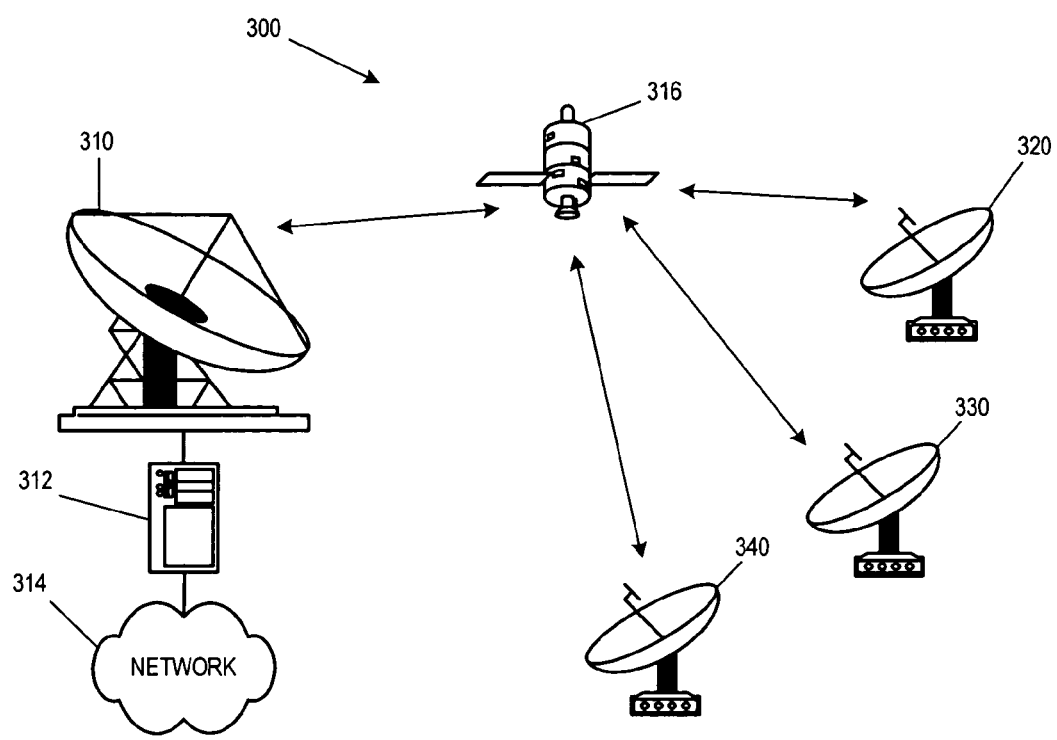
FIG. 13 is a block diagram of an example satellite communication system that may incorporate the novel systems and methods disclosed herein.

FIG. 13 is a block diagram of an example satellite communication system 300 that may incorporate the novel systems and methods disclosed herein. The system of FIG. 13 includes an uplink antenna 310 connected to a satellite hub station 312. The hub station 312 may comprise a network controller or other system control device hardware and software operable to monitor and/or control data communication parameters, and also includes a transmitter and receiver subsystem. The satellite hub station 312, in turn, is connected to a network 314, such as the Internet or other data provider network. The hub station 312 communicates via a satellite 316 with a plurality of remote terminals 320, 330 and 340. Each remote terminal 320, 330 and 340 typically comprises a dish antenna and satellite modem.

The hub station 312 may generate a forward link time division multiplexed (TDM) signal that is received by the remote terminals 320, 330 and 340. The forward link signal may conform to a satellite communication standard that incorporates VCM or ACM, such as the DVB-S2 standard. All terminals 320, 330 and 340 may communicate back to the hub station 312 using one or more burst multi-frequency, time division multiple access (MF-TDMA) return link channels, or by other physical layer formats.

The hub station 312 and terminals 420, 430 and 440 may comprise hardware and/or software realizing the novel decoding systems and methods disclosed herein. For example, the terminals 420, 430 and 440 may comprise one or more ASICs or FPGAs that realize the novel decoding systems and methods disclosed herein. Other hardware implementations may also be used.

The systems and methods described herein may be used to implement highly-parallel and efficient LDPC decoders. Slight modifications in the architecture details will make the systems and methods herein portable to different code designs.

The steps and the order of the steps in the methods and flowcharts described herein may be altered, modified and/or augmented and still achieve the desired outcome. Additionally, the methods, flow diagrams and structure block diagrams described herein may be implemented in the example processing devices described herein by program code comprising program instructions that are executable by the device processing subsystem. Other implementations may also be used, however, such as firmware or even appropriately designed hardware configured to carry out the methods and flow diagrams or implement the structure block diagrams described herein. Additionally, the methods, flow diagrams and structure block diagrams that describe particular methods and/or corresponding acts in support of steps and corresponding functions in support of disclosed software structures may also be implemented in software stored in a computer readable medium and equivalents thereof. The software structures may comprise source code, object code, machine code, or any other persistently or temporarily stored code that is operable to cause one or more processing systems to perform the methods described herein or realize the structures described herein.

This written description sets forth the best mode of the invention and provides examples to describe the invention and to enable a person of ordinary skill in the art to make and use the invention. This written description does not limit the invention to the precise terms set forth. Thus, while the invention has been described in detail with reference to the examples set forth above, those of ordinary skill in the art may effect alterations, modifications and variations to the examples without departing from the scope of the invention.

What is claimed is:

1. A communication terminal, comprising:
   a decoding circuit configured to decode encoded data that as been encoded according to a coding scheme defining a parity check matrix having sets of linearly shifted parity check equations, the decoding circuit comprising:
      node data reordering circuitry configured to:
         receive channel soft input data;
         identify information bits of the received soft input data and arrange the identified information bits in a first order; and
         identify parity bits of the received soft input data and reorder and arrange the identified parity bits in a second order, the parity bits reordered to correspond to a set of linearly shifted parity check equations defined by the parity check matrix;
      an input buffer configured to store the information bits arranged in the first order and the parity bits arranged in the second order;
      a bit node processing block comprising a plurality of bit node processors, the bit node processors arranged in parallel sets of bit node processors, each parallel set of bit node processors corresponding to the set of linearly shifted parity check equations defined by the parity check matrix, the bit node processing block further configured to access the input buffer to read the information bits arranged in the first order and the parity bits arranged in the second order and generate edge data;
      a check node processing block comprising a plurality of check node processors, the check node processors arranged in parallel sets of check node processors according to bit node and check node edges defined by the parity check matrix, the check node processing block further configured to generate edge data; and
      an edge memory configured to store the edge data.

2. The communication terminal of claim 1, wherein:
the decoding circuit is further configured to perform node data reordering for bit node to check node interconnections to store edge data for check node processing in sequential address locations in the edge memory.

3. The communication terminal of claim 1, wherein:
the decoding circuit further comprises a counter address generator to generate sequential edge memory addresses for check node processing, the sequential edge memory address utilized to read edge data stored in the edge memory for check node processing.

4. The communication terminal of claim 1, wherein:
the decoding circuit further comprises a shifter circuit configured to perform a first shift on edge data read from the edge memory to be provided as input to bit node processors, and perform a second shift on edge data read from the edge memory to be provided as input to check node processors.

5. The communication terminal of claim 4, wherein:
the shifter circuit comprises a barrel shifter circuit, and wherein the second shift is an inverse of the first shift.

6. The communication terminal of claim 5, wherein:
the edge data generated by the bit node processing block and the check node processing block is not shifted for writing to the edge memory.

7. The communication terminal of claim 1, wherein:
the edge data generated by the bit node processing block is formatted in a first data format, and the edge data generated by the check node processing block is formatted in a second data format; and
the decoding circuit further comprises a formatting circuit, the formatting circuit configured to convert the edge data read from the edge memory from the second data format to the first data format for the bit node processing, and to convert the edge data read from the edge memory from the first data format to the second data format for check node processing.

8. The communication terminal of claim 7, wherein:
the edge data generated by the bit node processing block is written to the edge memory in the first data format and the edge data generated by the check node processing block is written to the edge memory in the second data format.

9. The communication terminal of claim 8, wherein:
the first data format is a 2's complement data format and the second data format is a sign-magnitude format.

10. The communication terminal of claim 1, wherein:
the edge data defines operands for use in bit node processing and check node processing, and wherein each of the check node processors comprises:
a selection and parity processing circuit configured to receive edge data from the edge memory and select a plurality of operands from the edge data based on a selection criterion and to generate an overall parity signal; and
a check node accumulator circuit configured to receive a selection data from the selection and parity processing circuit and to select two of the selected plurality of operands in response, and to generate logarithmic accumulation data based on the two of the selected plurality of operands.

11. The communication terminal of claim 10, wherein:
the plurality of operands comprises three operands having the smallest magnitudes of all the operands defined by the edge memory for check node processing by a check node processor.

12. The communication terminal of claim 11, wherein: the check node accumulator circuit comprises:
a first multiplier to multiply an edge sign signal and the overall parity signal and produce a first output;
an error correction processor to generate an error correction signal based on the two of the selected plurality of operands;
a summer to determine the difference between the error correction signal and one of the two of the selected plurality of operands and produce a second output, the one of the two of the selected plurality of operands having the smallest magnitude; and
a second multiplier to multiply the first output and the second output.

13. The communication terminal of claim 1, wherein:
the decoding circuit is further configured to initialize the edge memory in an all-zero state and perform bit node processing to initialize the edge memory with the channel soft input data.

14. The communication terminal of claim 1, wherein:
upon a successful decode condition, the decoding circuit is further configured to sum edge data generated by the bit node processors with the channel soft input data to generate a final sum and perform a hard-decision decode on the final sum to determine if the decoded bit is a 0 or 1.

15. The communication terminal of claim 1, wherein:
the decoding circuit comprises an application specific integrated circuit (ASIC).

16. The communication terminal of claim 1, wherein the decoding circuit comprises a field programmable gate array (FPGA).

17. The communication terminal of claim 1, wherein the communication terminal is a satellite modem.

18. A method of decoding encoded data that has been encoded according to a coding scheme defining a parity check matrix having set of linearly shifted parity check equations, the method comprising:
receiving channel soft input data;
identifying information bits of the received soft input data and arranging the identified information bits in a first order;
identifying parity bits of the received soft input data and reordering and arranging the identified parity bits in a second order, the parity bits reordered to correspond to a set of linearly shifted parity check equations defined by the parity check matrix;
storing the information bits arranged in the first order and the parity bits arranged in the second order in an input buffer;
performing bit node processing on the information bits arranged in the first order and the parity bits arranged in the second order to generate edge data, wherein the bit node processing is performed by a plurality of parallel bit node processors corresponding to the set of linearly shifted parity check equations defined by the parity check matrix;
performing check node processing to generate the edge data, wherein the check node processing is performed by a plurality of parallel check node processors; and
reordering the edge data to store the edge data for check node processing in sequential address locations.

19. The method claim 18, further comprising:
performing a first shift on edge data provided as input for bit node processing; and performing a second shift on edge data read provided as input for check node processing; wherein the first shift is an inverse of the second shift.

20. The method of claim 18, wherein:
performing bit node processing and check node processing to generate edge data comprises:
generating edge data in a first data format from bit node processing; generating edge data in a second data format from check node processing;
converting the edge data provided as input for bit node processing from the second data format to the first data format; and
converting the edge data provided as input for check node processing from the first data format to the second data format.

21. The method of claim 18, further comprising: selecting three edge values from a plurality of edge values for processing a current edge;
selecting two of the three edge values as input into an accumulation operation, one of the two of the three edge values having the smallest magnitude of the three edge values; and
determining an overall parity of the plurality of edge values.

22. A communication terminal for decoding encoded data that has been encoded according to a coding scheme defining a parity check matrix having sets of linearly shifted parity check equations, comprising:
means for receiving channel soft input data;
means for identifying information bits of the received soft input data and arranging the identified information bits in a first order;
means for identifying parity bits of the received soft input data and reordering and arranging the identified parity bits in a second order, the parity bits reordered to correspond to a set of linearly shifted parity check equations defined by the parity check matrix;
means for storing the information bits arranged in the first order and the parity bits arranged in the second order in an input buffer;
means for performing bit node processing on the information bits arranged in the first order and the parity bits arranged in the second order to generate edge data, wherein the means for performing bit node processing comprises a plurality of parallel bit node processors corresponding to the set of linearly shifted parity check equations defined by the parity check matrix;

means for performing check node processing to generate the edge data, wherein the means for performing check node processing comprise a plurality of parallel check node processors; and means for reordering the edge data to store the edge data for check node processing in sequential address locations.

23. The communication terminal of claim 22, further comprising:

means for performing a first shift on edge data provided as input for bit node processing and for performing a second shift on edge data read provided as input for check node processing, the first shift is an inverse of the second shift.

24. The communication terminal of claim 23, further comprising:

means for converting the edge data provided as input for check node processing from a first data format to a second data format, and for converting the edge data provided as input for bit node processing from the second data format to the first data format.

25. A communication terminal, comprising:

a decoding circuit configured to decode encoded data that has been encoded according to a coding scheme defining a parity check matrix having sets of linearly shifted parity check equations, the decoding circuit comprising:

node data reordering circuitry configured to:

receive channel soft input data;

identify information bits of the received soft input data and arrange the identified information bits in a first order; and identify parity bits of the received soft input data and reorder and arrange the identified parity bits in a second order, the parity bits reordered to correspond to a set of linearly shifted parity check equations defined by the parity check matrix;

a bit node processing block to perform bit node processing on the information bits arranged in the first order and the parity bits arranged in the second order to generate edge data, wherein the bit node processing block comprises a plurality of parallel bit node processors corresponding to the set of linearly shifted parity check equations defined by the parity check matrix;

an edge memory storing the edge data, the edge data defining operands for use in bit node processing and check node processing;

a check node processing block comprising a plurality of parallel check node processors, each of the check node processors comprising:

a selection and parity processing circuit configured to receive edge data from the edge memory and select a plurality of operands from the edge data based on a selection criterion and to generate an overall parity signal; and a check node accumulator circuit configured to receive a selection data from the selection and parity processing circuit and to select two of the selected plurality of operands in response, and to generate logarithmic accumulation data based on the two of the selected plurality of operands.

26. The communication terminal of claim 25, wherein:

the plurality of operands comprises three operands having the smallest magnitudes of all the operands defined by the edge memory for check node processing by the check node processor.

27. The communication terminal of claim 26, wherein: the check node accumulator circuit comprises:

a first multiplier to multiply an edge sign signal and the overall parity signal and produce a first output;

an error correction processor to generate an error correction signal based on the two of the selected plurality of operands;

a summer to determine the difference between the error correction signal and one of the two of the selected plurality of operands, the one of the two of the selected plurality of operands having the smallest magnitude and produce a second output; and a second multiplier to multiply the first output and the second output.

* * * * *